United States Patent
Kawai et al.

(10) Patent No.: US 9,312,023 B2
(45) Date of Patent: Apr. 12, 2016

(54) DEVICES AND METHODS OF PROGRAMMING MEMORY CELLS

(71) Applicant: Micron Technology, Inc., Boise, ID (US)

(72) Inventors: Koichi Kawai, Kanagawa (JP); Koji Sakui, Tokyo (JP); Peter Feeley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 103 days.

(21) Appl. No.: 14/027,709

(22) Filed: Sep. 16, 2013

(65) Prior Publication Data

US 2014/0016411 A1 Jan. 16, 2014

Related U.S. Application Data

(62) Division of application No. 13/178,217, filed on Jul. 7, 2011, now Pat. No. 8,537,623.

(51) Int. Cl.
| | |
|---|---|
| *G11C 16/06* | (2006.01) |
| *G11C 16/34* | (2006.01) |
| *G11C 11/56* | (2006.01) |

(52) U.S. Cl.
CPC ........ *G11C 16/3404* (2013.01); *G11C 11/5628* (2013.01); *G11C 16/3427* (2013.01); *G11C 16/3459* (2013.01)

(58) Field of Classification Search
None
See application file for complete search history.

(56) References Cited

U.S. PATENT DOCUMENTS

| | | | |
|---|---|---|---|
| 6,888,758 B1 | 5/2005 | Hemink et al. | |
| 6,996,004 B1 | 2/2006 | Fastow et al. | |
| 7,400,535 B2 | 7/2008 | Li | |
| 7,599,224 B2 | 10/2009 | Lee | |
| 7,898,864 B2 | 3/2011 | Dong | |
| 2003/0002348 A1* | 1/2003 | Chen et al. | 365/189.01 |
| 2003/0128586 A1* | 7/2003 | Chen et al. | 365/185.11 |
| 2004/0170056 A1 | 9/2004 | Shibata et al. | |
| 2005/0018484 A1 | 1/2005 | Sakuma et al. | |
| 2006/0120162 A1 | 6/2006 | Fujiu et al. | |
| 2006/0245257 A1 | 11/2006 | Nazarian | |
| 2007/0177431 A1 | 8/2007 | Matsunaga et al. | |
| 2007/0253249 A1* | 11/2007 | Kang et al. | 365/185.03 |

(Continued)

FOREIGN PATENT DOCUMENTS

| | | | |
|---|---|---|---|
| WO | 2008011439 A2 | 1/2008 | |
| WO | 2008011440 A2 | 1/2008 | |
| WO | 2009038961 A2 | 3/2009 | |

*Primary Examiner* — Son Dinh
*Assistant Examiner* — Uyen B Tran
(74) *Attorney, Agent, or Firm* — Dicke, Billig & Czaja, PLLC (57) ABSTRACT

Devices and methods of programming memory cells, both SLC and MLC, such as to reduce charge-storage structure to charge-storage structure coupling, are shown and described. Programming of memory cells can include comparing a first page of data to a second page of data, and further programming cells corresponding to the first page of data that will not likely be affected by coupling from programming the second page of data.

20 Claims, 7 Drawing Sheets

(56) References Cited

U.S. PATENT DOCUMENTS

| | | | |
|---|---|---|---|
| 2008/0056007 A1* | 3/2008 | Kang | G11C 11/5628 365/185.22 |
| 2008/0158999 A1 | 7/2008 | Ha | |
| 2008/0173916 A1* | 7/2008 | Nishihara | 257/298 |
| 2008/0253188 A1 | 10/2008 | Aritome | |
| 2008/0304319 A1 | 12/2008 | Shibata et al. | |
| 2009/0190397 A1 | 7/2009 | Cho et al. | |
| 2009/0285028 A1 | 11/2009 | Park | |
| 2009/0310413 A1* | 12/2009 | Lasser | 365/185.12 |
| 2010/0020620 A1 | 1/2010 | Kim et al. | |
| 2010/0142270 A1 | 6/2010 | Shibata | |
| 2010/0214844 A1 | 8/2010 | Lee et al. | |
| 2010/0254188 A1* | 10/2010 | Ohsuk et al. | 365/185.03 |
| 2010/0259978 A1* | 10/2010 | Roohparvar | G11C 11/5628 365/185.02 |
| 2011/0038204 A1 | 2/2011 | Chou | |
| 2011/0149652 A1* | 6/2011 | Lee | 365/185.11 |

* cited by examiner

DEVICES AND METHODS OF PROGRAMMING MEMORY CELLS

RELATED APPLICATIONS

This application is a divisional of U.S. patent Ser. No. 13/178,217, titled "DEVICES AND METHODS OF PROGRAMMING MEMORY CELLS", filed Jul. 7, 2011 (allowed), which is commonly assigned and incorporated herein by reference.

FIELD

The present disclosure relates generally to memories, and in particular, in one or more embodiments, the present disclosure relates to programming memory cells.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of a charge storage structure (e.g., a floating gate or charge trap), or other physical phenomena (e.g., phase change or polarization), determine the data state of each cell. Common uses for flash memory include personal computers, personal digital assistants (PDAs), digital cameras, digital media players, digital recorders, games, appliances, vehicles, wireless devices, cellular telephones, and removable memory modules, and the uses for flash memory continue to expand.

Flash memory typically utilizes one of two basic architectures known as NOR flash and NAND flash. The designation is derived from the logic used to read the devices. In NOR flash architecture, a logical column of memory cells is coupled in parallel with each memory cell coupled to a data line, such as those typically referred to as bit lines. In NAND flash architecture, a column of memory cells is coupled in series with only the first memory cell of the column coupled to a bit line.

As the performance and complexity of electronic systems increase, the requirement for additional memory in a system also increases. However, in order to continue to reduce the costs of the system, the parts count must be kept to a minimum. This can be accomplished by increasing the memory density of an integrated circuit by using such technologies as multilevel cells (MLC). For example, MLC NAND flash memory is a very cost effective non-volatile memory.

Multilevel cells can take advantage of the analog nature of a traditional flash cell by assigning a data state, e.g., a bit pattern, to a specific threshold voltage (Vt) range of the cell. In the industry, these data states are often referred to as "levels." This technology permits the storage of two or more bits of information per cell, depending on the quantity of voltage ranges assigned to the cell and the stability of the assigned voltage ranges during the lifetime operation of the memory cell.

In many flash memories, both single level cell (SLC) and MLC memories, charge storage structure coupling has increased, in part due to increasing memory densities and the like. Coupling occurs between access lines (such as those lines referred to as word lines) and between data lines (such as those lines referred to as bit lines). Coupling issues between word lines of adjacent pages of a memory, such as between even and odd memory pages, depends on the bit pattern for the data that is to be programmed in the memory. When cell threshold voltages change due to programming, the changes in threshold voltage can further increase coupling effects.

For the reasons stated above, and for other reasons which will become apparent to those skilled in the art upon reading and understanding the present specification, there is a need in the art for improved compensation in memories.

DETAILED DESCRIPTION

In the following detailed description of the present embodiments, reference is made to the accompanying drawings that form a part hereof, and in which is shown by way of illustration specific embodiments in which the embodiments may be practiced. These embodiments are described in sufficient detail to enable those skilled in the art to practice the invention, and it is to be understood that other embodiments may be utilized and that process, electrical or mechanical changes may be made without departing from the scope of the present disclosure. The following detailed description is, therefore, not to be taken in a limiting sense.

Figure 1:
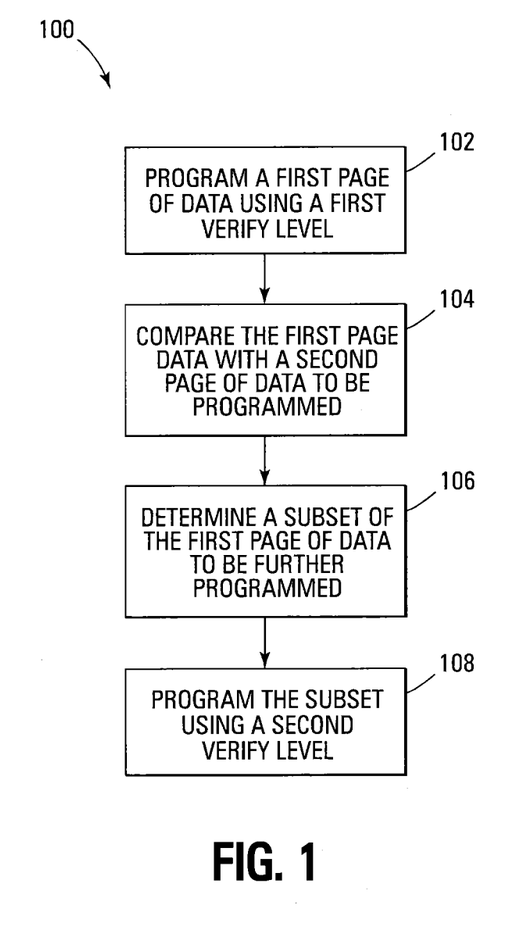
FIG. 1 is a flow chart diagram of a method according to one embodiment of the disclosure.

A method 100 of programming a memory is shown in FIG. 1. Method 100 comprises programming a first page of data using a first verify level in block 102, comparing the first page of data with a second (e.g., adjacent) page of data to be programmed in block 104, determining a subset of the first page of data to be further programmed in block 106, and programming the subset using a second verify level in block 108. Comparing as in block 104 is, in one embodiment, done by combining the first page of data with an inverse of the second page of data in an OR function. With the OR function, determining a subset in one embodiment is as follows.

When a cell to be programmed with data for the second page is to remain erased (e.g., to remain a logical 1), there is likely to be no noticeable coupling effect on an adjacent cell programmed with data for the first page. In this situation, the cell programmed to the first verify level can safely be programmed higher, to a second verify level (e.g., corresponding to its target level). When a cell to be programmed with data for the second page is to be programmed (e.g., to a logical 0), there is likely to be a noticeable coupling effect of that program voltage on an adjacent cell programmed with data for the first page. In this situation, the cell programmed to the first verify level is inhibited from further programming, since the coupling due to programming the second page of data will move the threshold voltage of that cell toward its target level.

Figure 2:
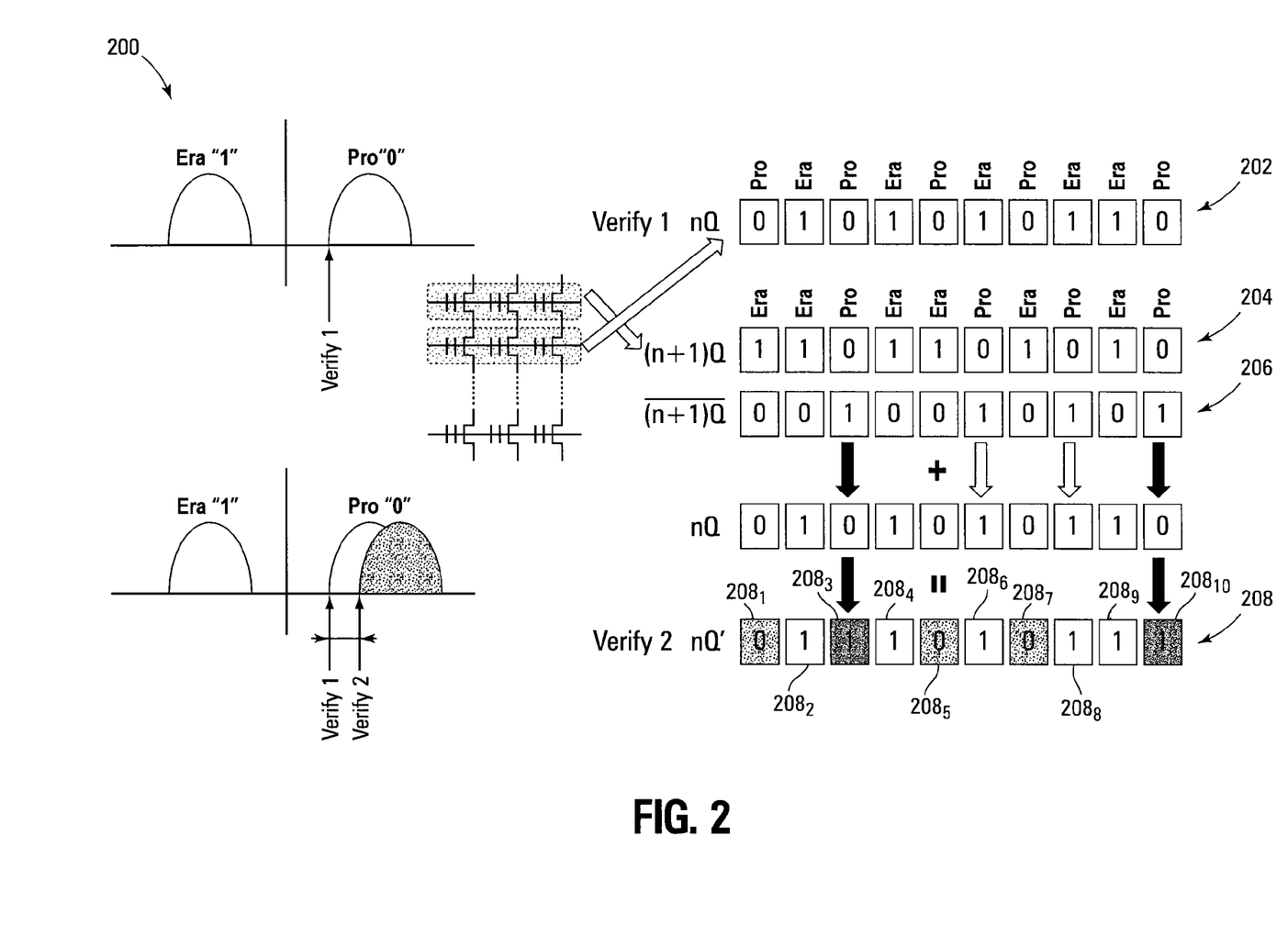
FIG. 2 is a graphical representation of threshold voltage levels for a single level cell memory programmed according to the method of FIG. 1.

An example 200 of a programming operation is shown in FIG. 2. At initiation, all cells are erased, so all cells are starting from an erase threshold voltage. For purposes of this example, the first page of data is identified as nQ 202 and is represented by 0 (program) and 1 (erase) values, with the nQ data represented as 0101010110. The second page of data is identified as (n+1)Q 204 and is also represented by 0 (program) and 1 (erase) values, with the (n+1)Q data represented as 1101101010. The inverse of the (n+1)Q data (also referred to as (n+1)Q') 206, is 0010010101.

In this example, the nQ data is programmed using threshold voltage level program 0 (verify 1). Five of the cells to be programmed with the nQ data are programmed, while five remain erased. The (n+1)Q data are determined, inverted, and combined in an OR function with the nQ data. Combining the data 202 and the data 206 in an OR function results in data 208, which is represented as 0111010111 for items $208_1$ through $208_{10}$. Items $208_1$, $208_3$, $208_5$, $208_7$, and $208_{10}$ indicate OR results for programmed cells corresponding to the first page of data nQ 202 (which are referred to hereinafter as "programmed cells of the first page"). Items $208_2$, $208_4$, $208_6$, $208_8$, and $208_9$ indicate OR results for erased (1) cells corresponding to the first page of data nQ 202 (which are referred to hereinafter as "erased cells of the first page"). The results, either 0 or 1, corresponding to erased cells of the first page can be ignored, since it is unlikely that any disturb from charge-storage structure to charge-storage structure coupling for those cells will move those cells' threshold voltage value off of the erase threshold. The 1 results corresponding to programmed cells of the first page indicate that the corresponding cells of the second page will also be programmed. This means that there is likely to be a disturb associated with those cells. This triggers in one embodiment an inhibit of further programming of the corresponding cells of the first page. The 0 results corresponding to programmed cells of the first page indicate that corresponding cells of the second page will remain erased. This means that there is likely to be no or little disturb associated with those cells. This triggers in one embodiment further programming of cells of the first page corresponding to results $208_1$, $208_5$ and $208_7$ using a second threshold voltage level (verify 2). Programming continues with programming of the second page.

Figure 3:
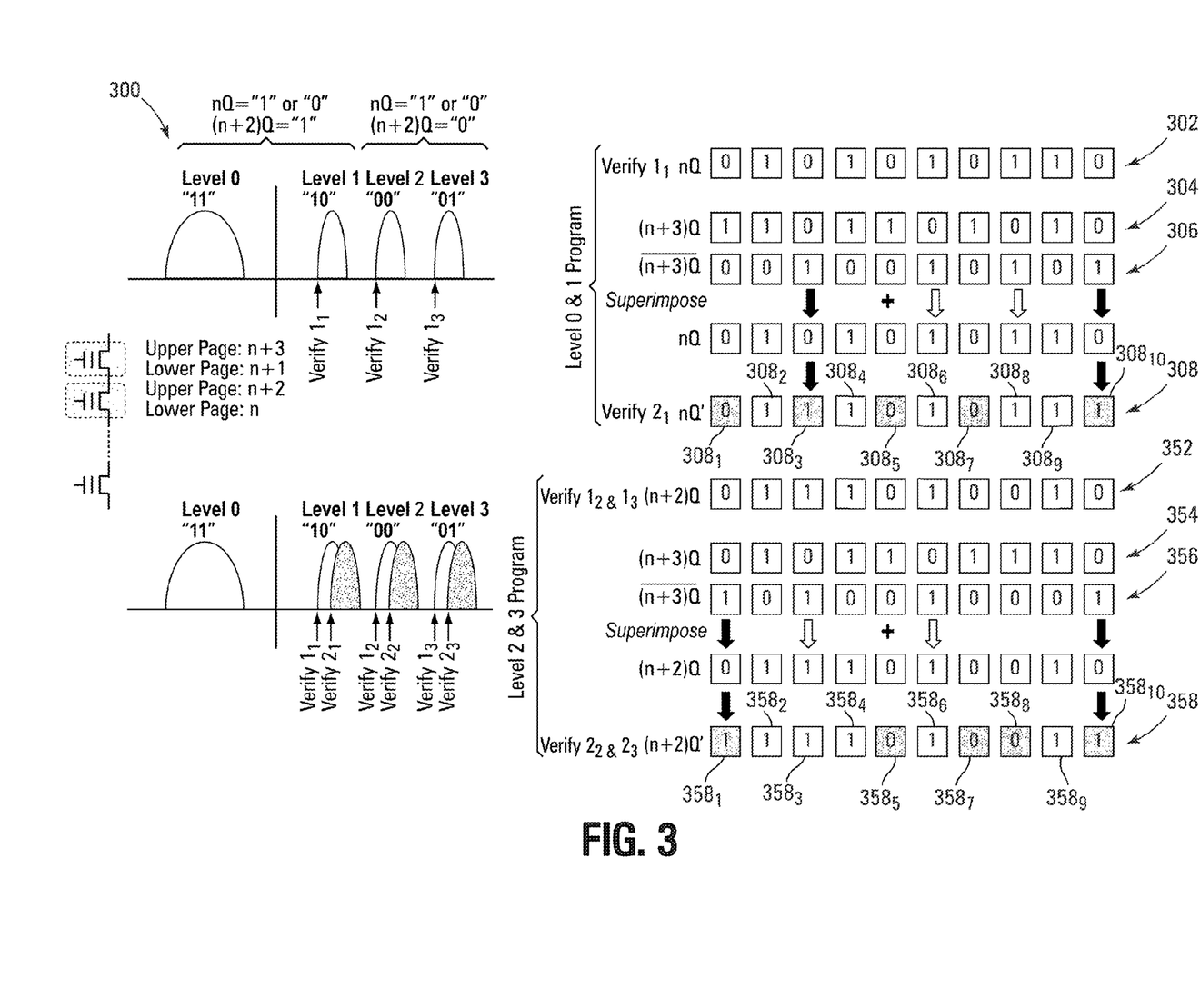
FIG. 3 is a graphical representation of threshold voltage levels for a multi level cell memory programmed according to the method of FIG. 1.

An example 300 of another programming operation is shown in FIG. 3. MLC memories differ from SLC memories in that they have, in addition to erase level 0, multiple program levels, shown in FIG. 3 as levels 1, 2, and 3. Example 300 is for a two bits per cell memory capable of storing four levels. In one embodiment, programming of the MLC of the example is performed in the following order: first lower page n is programmed first, followed by second (e.g., adjacent) lower page n+1, first upper page n+2, and second upper page n+3.

At initiation, all cells are erased, so all cells are starting from an erase threshold voltage. For purposes of this example, for programming of levels 0 and 1 of the first page, the first lower page of data is identified as nQ 302 and is represented by 0 (program) and 1 (erase) values, with the nQ data represented as 0101010110. The second upper page of data is identified as (n+3)Q 304 and is also represented by 0 (program) and 1 (erase) values, with the (n+3)Q data 304 represented as 1101101010. The inverse of the (n+3)Q data (also referred to as (n+3)Q') 306, is 0010010101. Additional verify levels verify $1_2$ and verify $1_3$ are used for programming of levels 2 and 3 of the MLC.

In this example, programming of levels 0 and 1 of the first page is accomplished as follows. The nQ data is programmed using threshold voltage level program 0 (verify $1_1$). Five of the cells to be programmed with nQ data are programmed, while five remain erased. The (n+3)Q data are determined, inverted, and combined in an OR function with the nQ data. Combining the data 302 and the data 306 in an OR function results in data 308, which is represented as 0111010111 for items $308_1$ through $308_{10}$. Items $308_1$, $308_3$, $308_5$, $308_7$, and $308_{10}$ indicate OR results for programmed cells corresponding to the first page of data nQ 302. Items $308_2$, $308_4$, $308_6$, $308_8$, and $308_9$ indicate OR results for erased (1) cells corresponding to the first page of data nQ 302. The results, either 0 or 1, corresponding to erased cells of the first page can be ignored, since it is unlikely that any disturb from coupling for those cells will move those cells' threshold voltage value off of the erase threshold. The 1 results corresponding to programmed cells of the first page indicate that corresponding cells of the second page will also be programmed during level 2 and 3 programming. This means that there is likely to be a disturb associated with those cells. This triggers, in one embodiment, an inhibit of further programming of the corresponding cells of the first page. The 0 results corresponding to programmed cells of the first page indicate that corresponding cells of the second page will not undergo programming during level 2 and 3 programming of the second page. This means that there is likely to be no or little disturb associated with those cells. This triggers in one embodiment further programming of those cells of nQ with the 308 results of 0 to a second threshold voltage level (verify $2_1$).

Following programming of levels 0 and 1 of the first page, the upper page programming is performed. For purposes of this example, for programming of levels 2 and 3 of the first page, the first upper page of data is identified as (n+2)Q 352 and is represented by 0 (program) and 1 (erase) values, with the (n+2)Q data represented as 0111010010. The second upper page of data is identified as (n+3)Q 354 and is also represented by 0 (program) and 1 (erase) values, with the (n+3)Q data represented as 1101101010. The inverse of the (n+3)Q data (also referred to as (n+3)Q') 356, is 0010010101.

In this example, programming of levels 2 and 3 of the first page is accomplished as follows. The (n+2)Q data is programmed using threshold voltage level program 2 or 3 (verify $1_2$ or verify $1_3$). In this example, the (n+2)Q data is represented as 0111010010. Five of the cells to be programmed with (n+2)Q data are programmed during level 2 and 3 programming, while five are not programmed during level 2 and 3 programming. The (n+3)Q data are determined, inverted, and combined in an OR function with the (n+2)Q data. Combining the data 352 and the data 356 in an OR function results in data 358, which is represented as 1111010011 for items $358_1$ through $358_{10}$. Items $358_1$, $358_5$, $358_7$, $358_8$, and $358_{10}$ indicate OR results for cells of the first page programmed during level 2 or 3 programming. Items $358_2$, $358_3$, $358_4$, $358_6$, and $358_9$ indicate OR results for cells of the first page not programmed during level 2 or 3 programming. The results, either 0 or 1, corresponding to cells of the first page not programmed during level 2 or 3 programming can be ignored, since it is unlikely that any disturb from coupling for those cells will move those cells' threshold voltage value off of their present threshold. The 1 results corresponding to cells of the first page that are to be programmed during level 2 or 3 programming indicate that corresponding cells of the second page will also be programmed during level 2 or 3 programming. This means that there is likely to be a disturb associated with those cells. This triggers in one embodiment an inhibit of further programming of corresponding cells of the first page. The 0 results corresponding to cells of the first page that are to be programmed during level 2 or 3 programming indicate that corresponding cells of the second page will not undergo programming during level 2 or 3 programming. This means that there is likely to be no or little disturb associated with those cells. This triggers in one embodiment further programming of those cells of the first page corresponding to results $358_5$, $358_7$ and $358_8$ using to one of two second threshold voltage levels (verify $2_2$ or verify $2_3$).

In various embodiments, the first page of data may be an even page of data of the memory, and the second page of data may be an odd page of data of the memory. In other embodiments, the first page of data may correspond to data to be programmed in a row of cells or part of a row of cells, while the second page of data may correspond to data to be programmed in an adjacent row of cells or part of an adjacent row of cells.

It should be understood that combination in an OR function may be accomplished using a variety of components without departing from the scope of the disclosure. By way of example only and not by way of limitation, an OR function can be implemented in various embodiments as a dedicated hardware circuit or within a controller. Considerations of speed versus die space allow the choice to be made as to how to implement an OR function.

The various embodiments described above with respect to FIGS. 1-3 are amenable for use with shielded bit line structures, as well as with bit line operations that address bit line disturbance. The embodiments can address word line disturbance, and in other embodiments, may be combined with known methods of addressing bit line disturbance, without departing from the scope of the disclosure.

Figure 4:
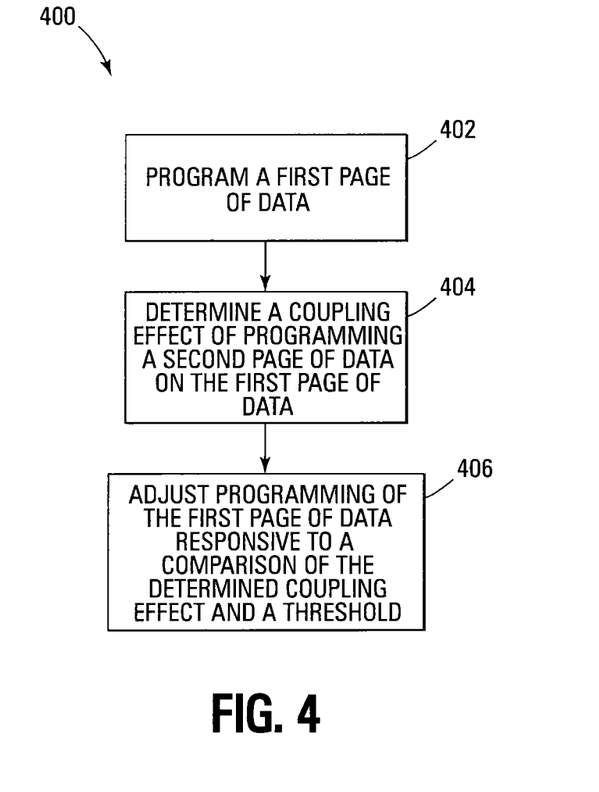
FIG. 4 is a flow chart diagram of a method according to another embodiment of the present disclosure.
Figure 5:
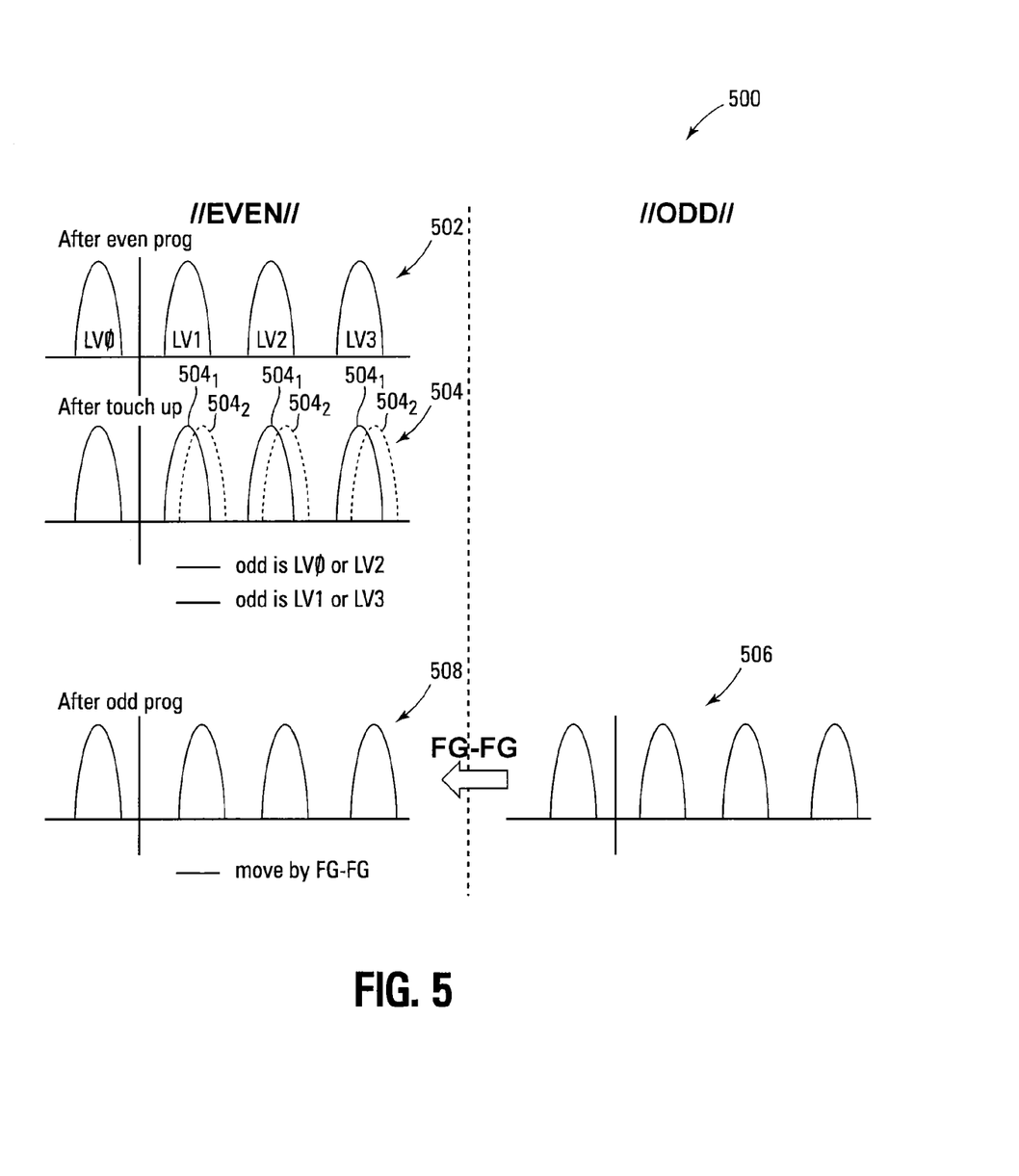
FIG. 5 is a graphical representation of threshold voltage levels for a memory programmed according to the method of FIG. 4.

Another embodiment of a method 400 of programming an MLC memory is shown in FIG. 4, and a graphical representation 500 of programming levels according to the method 400 is shown in FIG. 5. Method 400 comprises programming a first page of data in block 402, determining a coupling effect of programming a second (e.g., adjacent) page of data on the first page of data in block 404, and adjusting programming of the first page of data responsive to a comparison of the determined coupling effect and a threshold in block 406. Determining as in block 404 is in one embodiment done by loading the second page of data, and comparing the loaded second page of data with the programmed first page data. Adjusting in one embodiment comprises further programming those cells programmed with the first page of data adjacent to corresponding cells of the second page of data that will not be programmed during upper page programming.

In one embodiment, determining the coupling effect comprises determining to what level cells to be programmed with the second page of data are to be programmed. When a cell to be programmed with data of the second page of data is to be programmed to a higher threshold voltage level (for example level 1 or level 3 of a two bits per cell MLC as shown in FIG. 5), coupling is likely to induce a threshold voltage disturb associated with programming of those cells to those levels, so the initial program level for a corresponding cell programmed with the first page of data remains the same. When a cell to be programmed with data of the second page of data is to be programmed to a lower threshold voltage level (for example level 0 or level 2 of the two bits per cell MLC shown in FIG. 5), coupling is not likely to induce a threshold voltage disturb associated with programming of corresponding cells to those levels, so a supplemental programming process programs those cells of the first page to a higher threshold voltage distribution. Then, odd page programming is performed. This odd page programming moves the cells of the first page that correspond to programming of cells of the second page of data to the higher threshold voltage level, resulting in a tighter distribution of threshold voltages after the second page programming.

FIG. 5 shows example 500 of programming according to method 400. After programming a first page of data, memory cells programmed with the first page of data have a threshold voltage distribution as is shown at 502, with levels 0, 1, 2, and 3 (LV0, LV1, LV2, and LV3) as program levels. After the second page of data is loaded, a read of the cells programmed with the first page of data is performed, and further programming is performed for those cells programmed with the first page of data having a corresponding cell being programmed to levels 0 or 2 during programming of the second page of data, as is shown at 504. Distributions $504_1$ show the distributions for those levels that are not further programmed, and distributions $504_2$ show the distributions for those levels that are further programmed. For those cells programmed with the first page of data having a corresponding cell being programmed to levels 1 or 3 during programming of the second page of data, no further programming is performed. After programming the second page of data, the resulting distribution for the second page programming is shown at 506. The second page programming also causes a coupling effect on those distributions $504_1$ that moves those distributions to their final distributions to represent the programmed first page of data, as is shown at 508.

Figure 6:
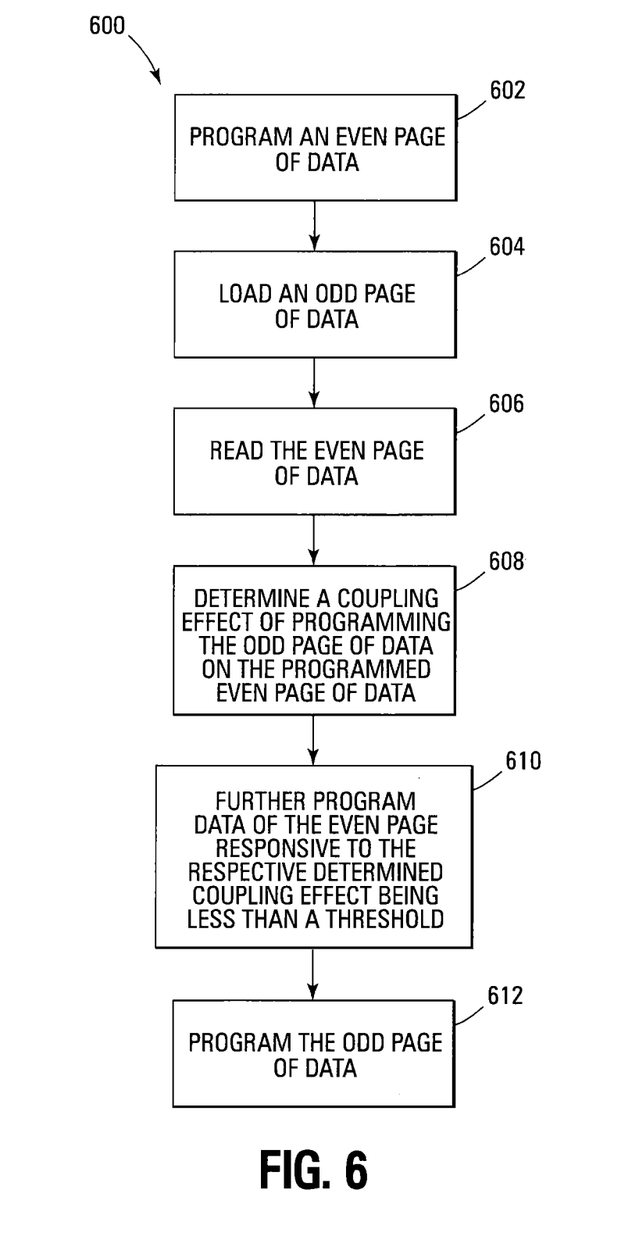
FIG. 6 is a flow chart diagram of a method according to another embodiment of the present disclosure.

In another embodiment, shown in FIG. 6, another method 600 of programming a memory is shown. Method 600 comprises programming an even page of data in block 602, loading an odd page of data in block 604, reading the even page of data in block 606, determining a coupling effect of programming the odd page of data on the programmed even page of data in block 608, further programming data of the even page responsive to the respective determined coupling effect being less than a threshold in block 610, and programming the odd page of data in block 612. Determining in one embodiment comprises determining an amount of threshold voltage movement between a cell programmed with data of the even page and a corresponding cell to be programmed with data of the odd page.

Figure 7:
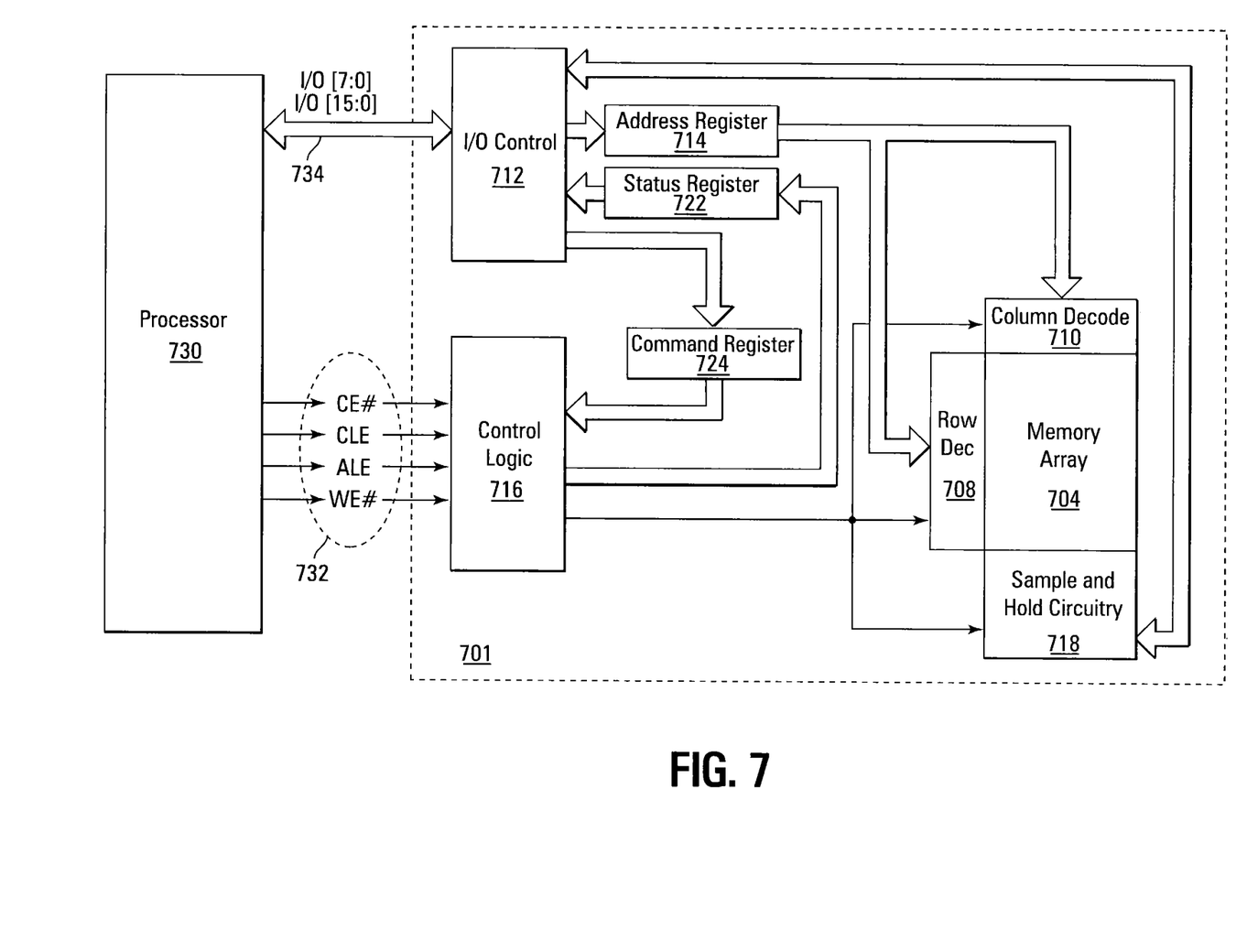
FIG. 7 is a block schematic of an electronic system in accordance with an embodiment of the disclosure.

FIG. 7 is a simplified block diagram of a memory device 701 according to an embodiment of the disclosure, and on which various embodiments of the disclosure can be practiced. Memory device 701 includes an array of memory cells 704 arranged in rows and columns. Although the various embodiments will be described primarily with reference to NAND memory arrays, the various embodiments are not limited to a specific architecture of the memory array 704. Some examples of other array architectures suitable for the present embodiments include NOR arrays, AND arrays, and virtual ground arrays. In general, however, the embodiments described herein are adaptable to, for example, any array architecture permitting generation of a data signal indicative of the threshold voltage of each memory cell. Further, the embodiments described herein are amenable for use with SLC and MLC memories without departing from the scope of the disclosure.

A row decode circuitry 708 and a column decode circuitry 710 are provided to decode address signals provided to the memory device 701. Address signals are received and decoded to access memory array 704. Memory device 701 also includes input/output (I/O) control circuitry 712 to manage input of commands, addresses and data to the memory device 701 as well as output of data and status information from the memory device 701. An address register 714 is coupled between I/O control circuitry 712 and row decode circuitry 708 and column decode circuitry 710 to latch the address signals prior to decoding. A command register 724 is coupled between I/O control circuitry 712 and control logic 716 to latch incoming commands. In one embodiment, control logic 716, control circuitry 712 and/or firmware can individually, in combination, or in combination with other elements, form a controller. As used herein, however, a controller need not necessarily include any or all of such components. In some embodiments, the controller can comprise an internal controller (e.g., located on the same die as the memory array) and/or an external controller. Control logic 716 controls access to the memory array 704 in response to the commands and generates status information for the external processor 730. The control logic 716 is coupled to row decode circuitry 708 and column decode circuitry 710 to control the row decode circuitry 708 and column decode circuitry 710 in response to the addresses.

Control logic 716 can be coupled to a sample and hold circuitry 718. The sample and hold circuitry 718 latches data, either incoming or outgoing, in the form of analog data signals. For example, the sample and hold circuitry could contain capacitors or other analog storage devices for sampling either an incoming data signal representing data to be written to a memory cell or an outgoing data signal indicative of the threshold voltage sensed from a memory cell. The sample and hold circuitry 718 may further provide for amplification and/or buffering of the sampled signal to provide a stronger data signal to an external device.

The handling of analog data signals may take an approach similar to an approach well known in the area of CMOS imager technology, where charge levels generated at pixels of the imager in response to incident illumination are stored on capacitors. These charge levels are then converted to signals using a differential amplifier with a reference capacitor as a second input to the differential amplifier. The output of the differential amplifier is then passed to analog-to-digital conversion (ADC) devices to obtain a digital value representative of an intensity of the illumination. In the present embodiments, a charge may be stored on a capacitor in response to subjecting it to a data signal indicative of an actual or target threshold voltage of a memory cell for reading or programming, respectively, the memory cell. This charge could then be converted to an analog data signal using a differential amplifier having a grounded input or other reference signal as a second input. The output of the differential amplifier could then be passed to the I/O control circuitry 712 for output from the memory device, in the case of a read operation, or used for comparison during one or more verify operations in programming the memory device. It is noted that the I/O control circuitry 712 could optionally include analog-to-digital conversion functionality and digital-to-analog conversion (DAC) functionality to convert read data from an analog data signal to a digital bit pattern and to convert write data from a digital bit pattern to an analog signal such that the memory device 701 could be adapted for communication with either an analog or digital data interface.

During a programming operation, target memory cells of the memory array 704 can be programmed until voltages indicative of their threshold voltage levels match the levels held in the sample and hold circuitry 718. This can be accomplished, as one example, using differential sensing devices to compare the held voltage level to a threshold voltage of the target memory cell. Much like traditional memory programming, programming pulses could be applied to a target memory cell to increase its threshold voltage until reaching or exceeding the desired value. In a read operation, the threshold voltage levels of the target memory cells are passed to the sample and hold circuitry 718 for transfer to an external processor (not shown in FIG. 7) either directly as analog signals or as digitized representations of the analog signals depending upon whether ADC/DAC functionality is provided external to, or within, the memory device.

Threshold voltages of cells may be determined in a variety of manners. For example, an access line, such as those typically referred to as word lines, voltage could be sampled at the point when the target memory cell becomes activated. Alternatively, a boosted voltage could be applied to a first source/drain side of a target memory cell, and the threshold voltage could be taken as a difference between its control gate voltage and the voltage at its other source/drain side. By coupling the voltage to a capacitor, charge would be shared with the capacitor to store the sampled voltage. Note that the sampled voltage need not be equal to the threshold voltage, but merely indicative of that voltage. For example, in the case of applying a boosted voltage to a first source/drain side of the memory cell and a known voltage to its control gate, the voltage developed at the second source/drain side of the memory cell could be taken as the data signal as the developed voltage is indicative of the threshold voltage of the memory cell.

Sample and hold circuitry 718 may include caching, i.e., multiple storage locations for each data value, such that the memory device 701 may be reading a next data value while passing a first data value to the external processor, or receiving a next data value while writing a first data value to the memory array 704. A status register 722 is coupled between I/O control circuitry 712 and control logic 716 to latch the status information for output to the external processor.

Memory device 701 receives control signals at control logic 716 over a control link 732. The control signals may include a chip enable CE#, a command latch enable CLE, an address latch enable ALE, and a write enable WE#. Memory device 701 may receive commands (in the form of command signals), addresses (in the form of address signals), and data (in the form of data signals) from an external processor over a multiplexed input/output (I/O) bus 734 and output data to the external processor over I/O bus 734.

In a specific example, commands are received over input/output (I/O) pins [7:0] of I/O bus 734 at I/O control circuitry 712 and are written into command register 724. The addresses are received over input/output (I/O) pins [7:0] of bus 734 at I/O control circuitry 712 and are written into address register 714. The data may be received over input/output (I/O) pins [7:0] for a device capable of receiving eight parallel signals, or input/output (I/O) pins [15:0] for a device capable of receiving sixteen parallel signals, at I/O control circuitry 712 and are transferred to sample and hold circuitry 718. Data also may be output over input/output (I/O) pins [7:0] for a device capable of transmitting eight parallel signals or input/output (I/O) pins [15:0] for a device capable of transmitting sixteen parallel signals. It will be appreciated by those skilled in the art that additional circuitry and signals can be provided, and that the memory device of FIG. 7 has been simplified to help focus on the embodiments of the disclosure.

Methods for reducing coupling and for programming memories may be performed in various embodiments on a memory such as memory 700. Such methods are shown and described herein with reference to FIGS. 1-6.

While FIG. 7 has been described with respect to sample and hold circuitry 718, it should be understood that the control logic 716 could be coupled to data latches instead of sample and hold circuitry 718 without departing from the scope of the disclosure. Data latches latch data, either incoming or outgoing. During a write operation, target memory cells of the memory array 704 are programmed, for example using two sets of programming pulses as described above, until voltages indicative of their threshold voltage levels match the data held in the data latches. This can be accomplished, as one example, using differential sensing devices to compare the held data to a threshold voltage of the target memory cell.

Additionally, while the memory device of FIG. 7 has been described in accordance with popular conventions for receipt and output of the various signals, it is noted that the various embodiments are not limited by the specific signals and I/O configurations described. For example, command and address signals could be received at inputs separate from those receiving the data signals, or data signals could be transmitted serially over a single I/O line of I/O bus 734. Because the data signals represent bit patterns instead of individual bits, serial communication of an 8-bit data signal could be as efficient as parallel communication of eight signals representing individual bits.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

What is claimed is:

1. A method of programming memory cells, comprising:
   programming a first page of data;
   determining a coupling effect of programming a second page of data after programming the first page of data and prior to programming the second page of data, wherein each memory cell corresponding to the first page of data and a respective adjacent memory cell corresponding to the second page of data are connected in series; and
   adjusting programming of the first page of data responsive to a comparison of the determined coupling effect and a threshold;
   wherein adjusting the programming of the first page of data comprises:
      adjusting programming for each memory cell corresponding to the first page of data that is programmed to a threshold voltage level above a particular threshold voltage level when its adjacent memory cell corresponding to the second page of data is to be programmed to a threshold voltage level below the particular threshold voltage level such that the determined coupling effect is less than the threshold; and
      not adjusting programming for any memory cell corresponding to the first page of data that is programmed to a threshold voltage level below the particular threshold voltage level and for any memory cell corresponding to the first page of data when the adjacent memory cell corresponding to the second page of data is to be programmed to a threshold voltage level above the particular threshold voltage level such that the determined coupling effect is greater than the threshold.

2. The method of claim 1, wherein determining comprises loading the second page of data; and
   comparing the loaded second page of data to the programmed first page of data.

3. The method of claim 1, wherein adjusting comprises further programming data of the first page having a determined coupling effect that is less than the threshold.

4. The method of claim 3, wherein further programming comprises further programming the data of the first page having a determined coupling effect less than the threshold to a higher programming level.

5. The method of claim 1, and further comprising programming the second page of data after adjusting programming of the first page of data.

6. The method of claim 1, wherein the memory cells comprise a multi-level cell (MLC) memory, and wherein adjusting comprises further programming data of the first page when corresponding memory cells to be programmed with the second page of data are to be programmed to a level of the MLC corresponding to a threshold voltage range below the particular threshold voltage level.

7. The method of claim 1, wherein the first page of data is an even page of data and the second page of data is an odd page of data.

8. The method of claim 1, wherein adjusting comprises further programming memory cells programmed with the first page of data adjacent to corresponding memory cells to be programmed with the second page of data that will not be programmed during an upper page programming operation.

9. The method of claim 1, and further comprising:
   determining the coupling effect by determining to what level memory cells to be programmed with the second page of data are to be programmed;
   and wherein adjusting comprises:
      for a memory cell of the second page to be programmed, when data of the second page of data for that memory cell is to be programmed to a higher threshold voltage level, maintaining an initial program level for a corresponding memory cell programmed with the first page of data; and
      for a memory cell of the second page to be programmed, when data of the second page of data for that memory cell is to be programmed to a lower threshold voltage level, programming using a supplemental programming process a corresponding memory cell of the first page to a higher threshold voltage distribution.

10. A method of programming memory cells, comprising:
    programming an even page of data;
    loading an odd page of data;
    reading the even page of data;
    determining a coupling effect of programming the odd page of data on the programmed even page of data prior to programming the odd page of data, wherein each memory cell corresponding to the even page of data and a respective adjacent memory cell corresponding to the odd page of data are connected in series;
    further programming data of the even page responsive to the respective determined coupling effect being less than a threshold; and
    programming the odd page of data after further programming the data of the even page;
    wherein further programming data of the even page comprises:
       further programming each memory cell corresponding to the even page of data that is programmed to a threshold voltage level above a particular threshold voltage level when its adjacent memory cell corresponding to the odd page of data is to be programmed to a threshold voltage level below the particular threshold voltage level; and inhibiting programming for any memory cell corresponding to the even page of data that is programmed to a threshold voltage level below the particular threshold voltage level and for any memory cell corresponding to the even page of data when the adjacent memory cell corresponding to the odd page of data is to be programmed to a threshold voltage level above the particular threshold voltage level.

11. The method of claim 10, wherein determining a coupling effect comprises determining an amount of threshold voltage movement between a memory cell programmed with data of the even page and its adjacent memory cell to be programmed with data of the odd page.

12. The method of claim 11, wherein further programming comprises programming the data of the even page having a determined coupling effect less than the threshold to a higher programming level.

13. The method of claim 10, wherein determining comprises:
   comparing the loaded odd page of data to the programmed even page of data.

14. A device, comprising:
   memory cells; and
   a controller configured to perform a method comprising:
      programming a first page of data;
      determining a coupling effect of programming a second page of data after programming the first page of data and prior to programming the second page of data, wherein each memory cell corresponding to the first page of data and a respective adjacent memory cell corresponding to the second page of data are connected in series; and
      adjusting programming of the first page of data responsive to a comparison of the determined coupling effect and a threshold;
      wherein adjusting the programming of the first page of data comprises:
         adjusting programming for each memory cell corresponding to the first page of data that is programmed to a threshold voltage level above a particular threshold voltage level when its adjacent memory cell corresponding to the second page of data is to be programmed to a threshold voltage level below the particular threshold voltage level such that the determined coupling effect is less than the threshold; and
         not adjusting programming for any memory cell corresponding to the first page of data that is programmed to a threshold voltage level below the particular threshold voltage level and for any memory cell corresponding to the first page of data when the adjacent memory cell corresponding to the second page of data is to be programmed to a threshold voltage level above the particular threshold voltage level such that the determined coupling effect is greater than the threshold.

15. The device of claim 14, wherein the controller is further configured to determine a coupling effect by:
   loading the second page of data; and
   comparing the loaded second page of data to the programmed first page of data.

16. The device of claim 14, wherein the controller is further configured to adjust programming of data on the first page by further programming data of the first page having a determined coupling effect that is less than the threshold.

17. The device of claim 16, wherein the controller is further configured to further program the data of the first page having a determined coupling effect less than the threshold to a higher programming level.

18. The device of claim 14, wherein the memory cells are multi level cells, and wherein the controller is further configured to further program data of the first page when corresponding memory cells to be programmed with the second page of data are to be programmed to a threshold voltage level below the particular threshold voltage level.

19. A device, comprising:
   memory cells; and
   a controller configured to:
      program an even page of data;
      load an odd page of data;
      read the even page of data;
      determine a coupling effect of programming the odd page of data on the programmed even page of data prior to programming the odd page of data, wherein each memory cell corresponding to the even page of data and a respective adjacent memory cell corresponding to the odd page of data are connected in series;
      further program data of the even page responsive to the respective determined coupling effect being less than a threshold; and
      program the odd page of data after further programming the data of the even page;
   wherein the controller is further configured to:
      further program each memory cell corresponding to the even page of data that is programmed to a threshold voltage level above a particular threshold voltage level when its adjacent memory cell corresponding to the odd page of data is to be programmed to a threshold voltage level below the particular threshold voltage level; and
      inhibit programming for any memory cell corresponding to the even page of data that is programmed to a threshold voltage level below the particular threshold voltage level and for any memory cell corresponding to the even page of data when the adjacent memory cell corresponding to the odd page of data is to be programmed to a threshold voltage level above the particular threshold voltage level.

20. The device of claim 19, wherein the controller is further configured to determine a coupling effect by determining an amount of threshold voltage movement between a cell programmed with data of the even page and a corresponding cell to be programmed with data of the odd page.

* * * * *